United States Patent
Osborn et al.

(10) Patent No.: US 7,719,693 B2
(45) Date of Patent: May 18, 2010

(54) INTERFEROMETRY SYSTEM CHAMBER VIEWING WINDOW

(75) Inventors: Jon V. Osborn, Thousand Oaks, CA (US); Josh A. Conway, Redondo Beach, CA (US); Jesse D. Fowler, Laguna Niguel, CA (US)

(73) Assignee: The Aerospace Corporation, El Segundo, CA (US)

( * ) Notice: Subject to any disclaimer, the term of this patent is extended or adjusted under 35 U.S.C. 154(b) by 215 days.

(21) Appl. No.: 11/789,013

(22) Filed: Apr. 23, 2007

(65) Prior Publication Data

US 2008/0259344 A1 Oct. 23, 2008

(51) Int. Cl.
*G01B 9/02* (2006.01)
(52) U.S. Cl. .................................. 356/511
(58) Field of Classification Search ............... 356/485, 356/489, 492, 495, 496, 511–514
See application file for complete search history.

(56) References Cited

U.S. PATENT DOCUMENTS 6,721,094 B1 * 4/2004 Sinclair et al. ............... 359/386
2005/0225770 A1 * 10/2005 Chapman et al. ............ 356/498

FOREIGN PATENT DOCUMENTS

WO    WO 02/096564 A1 * 12/2002

* cited by examiner

*Primary Examiner*—Samuel A Turner
(74) *Attorney, Agent, or Firm*—Ocean Law; Paul D Chancellor

(57) ABSTRACT

A stroboscopic imaging interferometer system includes an environmental chamber having a novel viewing window equipped with a rigidly integrated beam splitter and piezo actuated reference mirror for illuminating a device providing an object beam and reference mirror for providing a reference beam, upon the reflection of both beams, produces interference of the object beam by the reference beam for providing absolute phase observations of the device, that may be a MEMS device under test.

19 Claims, 5 Drawing Sheets

STROBOSCOPIC IMAGING INTERFEROMETER

STROBOSCOPIC IMAGING INTERFEROMETER

NOTCHED CHAMBER WINDOW

INTEGRATED CHAMBER WINDOW

INTEGRATED CHAMBER WINDOW

INTERFEROMETRY SYSTEM CHAMBER VIEWING WINDOW

STATEMENT OF GOVERNMENT INTEREST

The invention was made with Government support under contract No. FA8802-04-C-0001 by the Department of the Air Force. The Government has certain rights in the invention.

FIELD OF THE INVENTION

The invention relates to the field of interferometry. More particularly, the present invention relates to the viewing port of interferometry chambers for measuring surfaces of a device under inspection by an interferometry system.

BACKGROUND OF THE INVENTION

The harsh environment and stringent reliability requirements of space technology require detailed knowledge of the motion of all mechanical devices. The failure modes must be well understood and catalogued. While this may be a straight-forward analysis for macroscopic devices, microscopic mechanical structures require new tools to study their response under various conditions. In the existing art, static methods are generally employed and the motion of microelectromechanical systems (MEMS) is then analytically derived. These inferential results are unacceptable for the requirements of modern aerospace applications and are often lacking in their precision when related to dynamic operation. Thorough qualification of micro-mechanical systems requires directly observed, reliable data, lacking in conventional metrology systems.

To study the motion of microscopic mechanical parts, it is not practical to load them with sensors. Non-contact measurement techniques are at a premium for dynamic MEMS device measurement. Optical methods of interrogation are ideal under these restrictions, and such schemes are well documented in the literature, offering high resolution and rapid measurement with a non-contact technique. Test products using laser-Doppler vibrometry or white light interferometry are commercially available on the market today. These products, however, have serious drawbacks. The vibrometer only yields velocity data, not absolute shape or displacement. In addition to this failing, the vibrometer measures single points at a time, requiring accurate scanning and stitching over the entire surface of the test object. The actual motion and shape of the device must then be gained inferentially through analysis and is subject to many sources of error, both in the scanning and interpretation of device measurements.

The white light interferometer has similar problems. Although it can take an image rather than a point of data at a time, the object or reference mirror must be scanned to find the interference maxima at each imaging pixel. While this does generate displacement data over a large dynamic range, the long scan time relies on very highly repeated motion. Couple this requirement to a slightly noisy environment and the data becomes riddled with potential errors.

A conventional state-of-the-art solution that addresses these issues is the stroboscopic Michelson Interferometer or, a subset of those, the Twyman-Green interferometer. The test system can achieve sub-nanometer resolution interferometricly and diffraction limited lateral resolution using microscopic objectives. Although the Twyman-Green interferometer relies on repeated motion of the device for dynamic characterization, only five to six vertical scan steps are done per time step of device motion. Several configurations have been documented in which the interferometer outputs to an imaging system. When implemented with a camera or video device, this records data from a broad area of the device so no lateral scanning is required. The conventional Michelson or Twyman-Green test system is composed of bulk optical components. These tend to include a laser light source to illuminate the device and reference mirror, an optical beam splitter, and optical microscope objectives to image the sample onto a camera. The standard configuration is such that the illuminating optical beam is split at the beam splitter. One of the two outputs of the beam splitter proceeds to the reference mirror of the interferometer and is reflected back to the beam splitter. The second output beam is directed to the device under test, which also reflects it back to the beam splitter. These beams then recombine at the beam splitter and are directed to the camera to be recorded. When the test and reference arms have a path length within the coherence length of the source, interference fringes will cover the image. The choice of optical source is non-trivial. When the source has a very high degree of coherence, the tolerances on distance are eased, but the final image will be spotted with speckle patterns and interference from stray reflections, apertures and dust. When the coherence is very low, for example in a white light interferometer, the image will be crisp but interference will only occur over very narrow displacements. To avoid constant scanning of the reference mirror, the coherence length must be greater than twice the characteristic dimensions of the device under test.

To perform measurements on micrometer scale devices and samples, the conventional Michelson test system employs a microscope objective between the beam splitter and the test sample. This system relies on the interference of nearly identical optical fields so the optical paths to the test sample and reference mirror must be closely matched. This requires a second, identical microscope objective in the reference path so that the phase fronts have identical curvature. The second objective puts even further constraints on the allowed displacement tolerances. When the reference mirror is further from the objective than the test device, the phase front will have a different curvature and the fringes will show a warped surface. This creates a very difficult problem in calibrating the system. If one were to calibrate the system by inserting an optically flat mirror in place of the test sample, one would have to assure that the test sample was the same axial distance from the microscope when testing. This exact length tolerance would depend on the details. of the system but can be expected to be on the order of tens of micrometers. Achieving such precision is not practical in a manufacturing or testing environment.

In a conventional interferometer, vibration in any part of either optical path, that is, in the microscope objective path, reference mirror path, or at the device, is translated into measurement errors. This presents a serious obstacle to high fidelity metrology. Because interferometric systems are designed to measure distances on the order of nanometers, they are also sensitive to vibrations on that length scale as well. Currently, these types of microscopic interferometers disadvantageously require floating optical tables and controlled laboratory environments. These and other disadvantages are solved or greatly reduced using the present invention.

SUMMARY OF THE INVENTION

An object of the invention is to provide a window in an interferometry system for measuring the surface of a device under test in a chamber have a viewing window.

Yet another object of the invention is to provide a window in an interferometry system for measuring the surface of a device with immunity to vibrations and changes in environmental conditions.

Still another object of the invention is to provide a viewing window having a rigidly embedded optical beam splitter and attached reference mirror for canceling out phase differences between a reference beam and an object beam.

A further object of the invention is to provide an interferometry system chamber window including a rigidly embedded optical beam splitter and coupled reference mirror controlled by a piezo transducer for creating known phase differences between a reference beam and an object beam.

Yet a further object of the invention is to provide a system having a viewing window including a rigidly embedded optical beam splitter and coupled reference mirror controlled by a piezo transducer for creating known phase differences between a reference beam and an object beam using a system controller for controlling the piezo actuator.

The invention is directed to a stroboscopic interferometry system to provide directly observed, reliable topology data using an environmental observation chamber which houses a device under inspection testing. The system is characterized by having an optical beam splitter located within the window and a rigidly attached reference mirror. A laser beam provides a side entering illumination source that is directed toward the reference mirror. The splitter passes part of the reference beam toward the reference mirror as the splitter also reflects part of the reference beam toward the device under test where it is reflected off of the device as an object beam. The reference beam is reflected off the reference mirror and then interferes with the object beam when they are recombined at the beam splitter. Because all of the components of the interferometer, including the beam splitter, reference mirror, and device under test, are rigidly fixed to the chamber, the vibration effects are greatly mitigated. The interfered object beam then proceeds to an objective lens for image recording.

The stroboscopic interferometer system has the capacity to resolve MEMS devices in motion in different partial pressure gaseous type atmospheres, while sweeping temperature ranges. This allows for not only time resolved microscopic images of the test device under stress, but it also yields out of plane resolution on the nanometer scale. An examination of a device under test allows for the observation of minute details of movement of the device under the controlled conditions. Only by employing the test device in a simulated space environment, can devices be evaluated as to a capacity to carry out extended space missions.

The system is an improved Twyman-Green interferometry system having the advantage of removing one of the microscope objectives from the interferometer system, and moving the objective outside of the interferometer. Additionally, by bringing the collimated laser beam directly onto the beam splitter, test device, and reference mirror, identical phase curvatures are assured. This can be achieved with loose requirements on both the collimation of the source and the displacement from the objective. The single microscope objective then collects the light from both arms simultaneously. This novel feature of a single microscope objective has other significant advantages. Of high importance to nanoscopic measurements, the single microscope objective yields a dramatic reduction in vibration because it is located outside of the interferometer optical paths. Because only vibrations of the reference mirror optical path or device under test optical path will cause phase error, the system enhances the stability of the measurement and the debilitating problems of reference phase and vibration noise are reduced.

Incorporating absolute phase reference and vibrational stability, the invention solves the problem of working distance through integration of splitter into the chamber window. By making the beam splitter and reference mirror a part of the chamber window, the system is robust and easy to use. To be precise, a cryo-chamber window has a beam splitter located within the window, preferably at the window center. A laser source provides a reference beam that travels along a window optical path running tangential to the pane and through the window. That is, a laser injects the reference beam into a side of the window. Half of the reference beam is reflected 90 degrees toward the device under test at the beam splitter and the other half proceeds straight through the window and splitter toward a reference mirror controlled by a piezo transducer. The reference beam reflects off the device under test as an object beam that passes back straight out of the window toward a microscope objective for measurement by an imager.

A laser provides the reference beam that passes directly through the beam splitter, never leaving the window, toward a reference mirror, along a window optical path. The reference beam reflects off the PZT mounted reference mirror that is preferentially integrated onto or into the chamber window. After this reflection off the reference mirror, the beam travels back to the beam splitter. The reference beam is then reflected 90 degrees, interferes with the object beam that then proceeds out of the chamber window.

An interferometry system can resolve longitudinal distances on sub-nanometer scales. This extreme sensitivity also means that the system is incredibly sensitive to air currents, sonic vibration, and other sources of noise present in the lab environment. By incorporating the interferometer optical paths into a single rigid body, the effects of vibration are attenuated even further. The system enables practical and routine laboratory interferometry use. The system provides improved immunity to noise with mobility and accessibility. By integrating the interferometric components into a single device, all of the optical alignment can be done during fabrication. The system can be easily used for making high optical alignments with very high-resolution measurements. These and other advantages will become more apparent from the following detailed description of the preferred embodiment.

DETAILED DESCRIPTION OF THE PREFERRED EMBODIMENT

Figure 1:
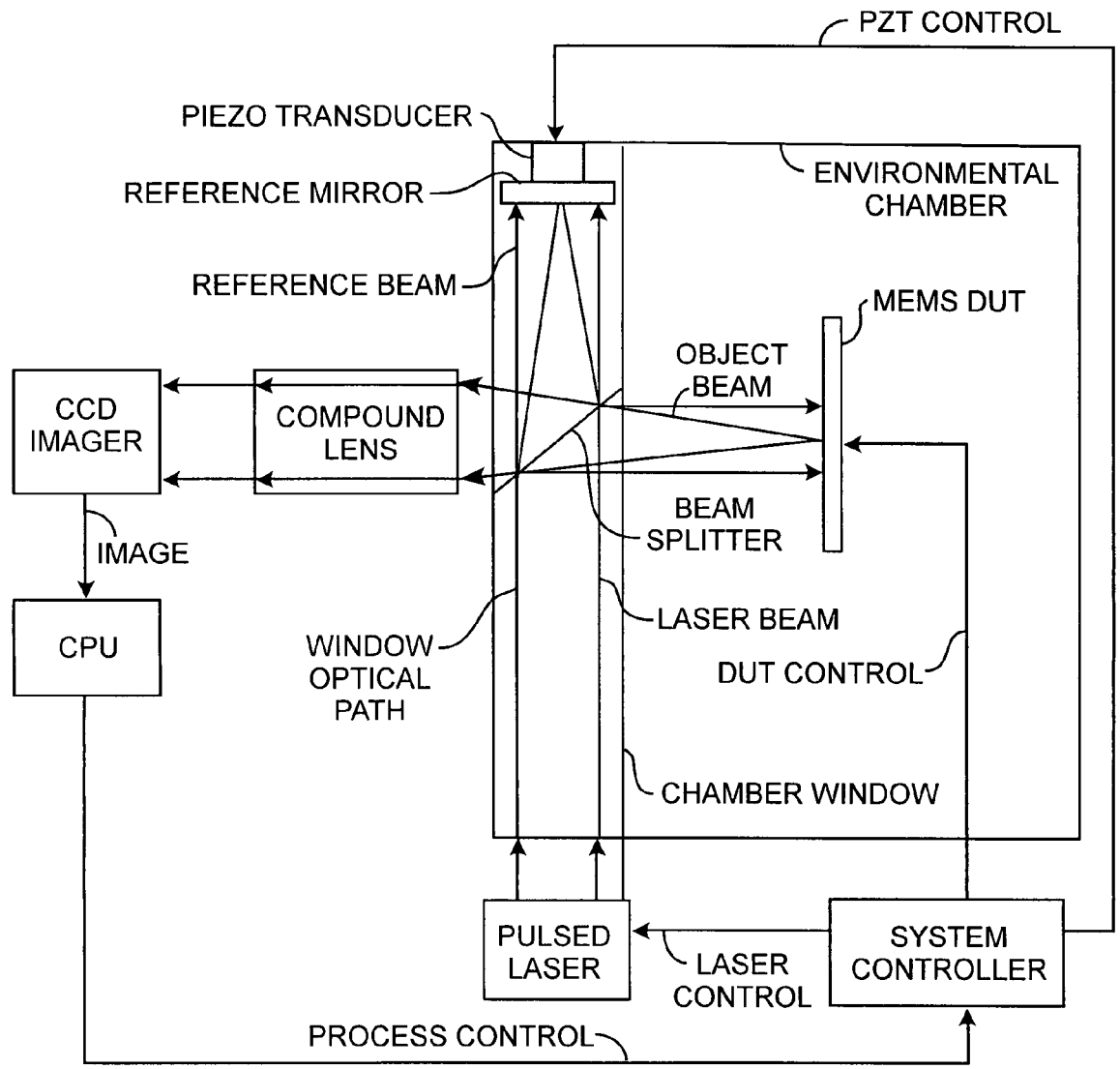
FIG. 1 is a block diagram of a stroboscopic imaging interferometer.

An embodiment of the invention is described with reference to the figures using reference designations as shown in the figures. Referring to FIG. 1, a pulsed laser emits a laser beam along a window optical path in a chamber window toward a splitter disposed in the chamber window of an environmental chamber. The splitter passes a portion of the laser beam as a reference beam toward a reference mirror and reflects another portion of the laser beam as an object beam toward a device under test (DUT) that may be a MEMS device. The DUT reflects the object beam back through the splitter and out the chamber window toward an objective lens that may be a compound lens. The phase of reference beam relative to that of the object beam is adjusted by actuation of a Piezo transducer (PZT). As the object beam passes through the splitter, the reference beam reflected off the reference mirror interferes with the object beam, creating an interference pattern. The object beam passes through the compound lens toward an imager that may be a charged coupled device (CCD) providing an image to the computer CPU. The CPU sends process control signals to a system controller. The system controller, in turn, sends a laser pulse control signal to the laser, sends a DUT control signals to the DUT, and sends the PZT control signals to the Piezo transducer for controlling operation of the reference mirror and coordinating overall interferometer operation and imaging by the imager. The CPU also serves as open loop control on the timing of the system, synchronizing the motion of the DUT with the pulsing of the laser and the frame rate of the camera. In this preferred form, the laser light source is incident from the side of the chamber window and is directed toward splitter and reference mirror. The window is characterized as having an entry portion for receiving a light beam, such as a laser beam, along a window optical path. The window has internal optics, such as the splitter, and has a rigidly affixed actuated reference mirror for providing a reference beam that interferes with a reflection, such as the object beam, of a device in a chamber housing the window. The chamber window can be configured in several preferred variations.

Figure 2A:
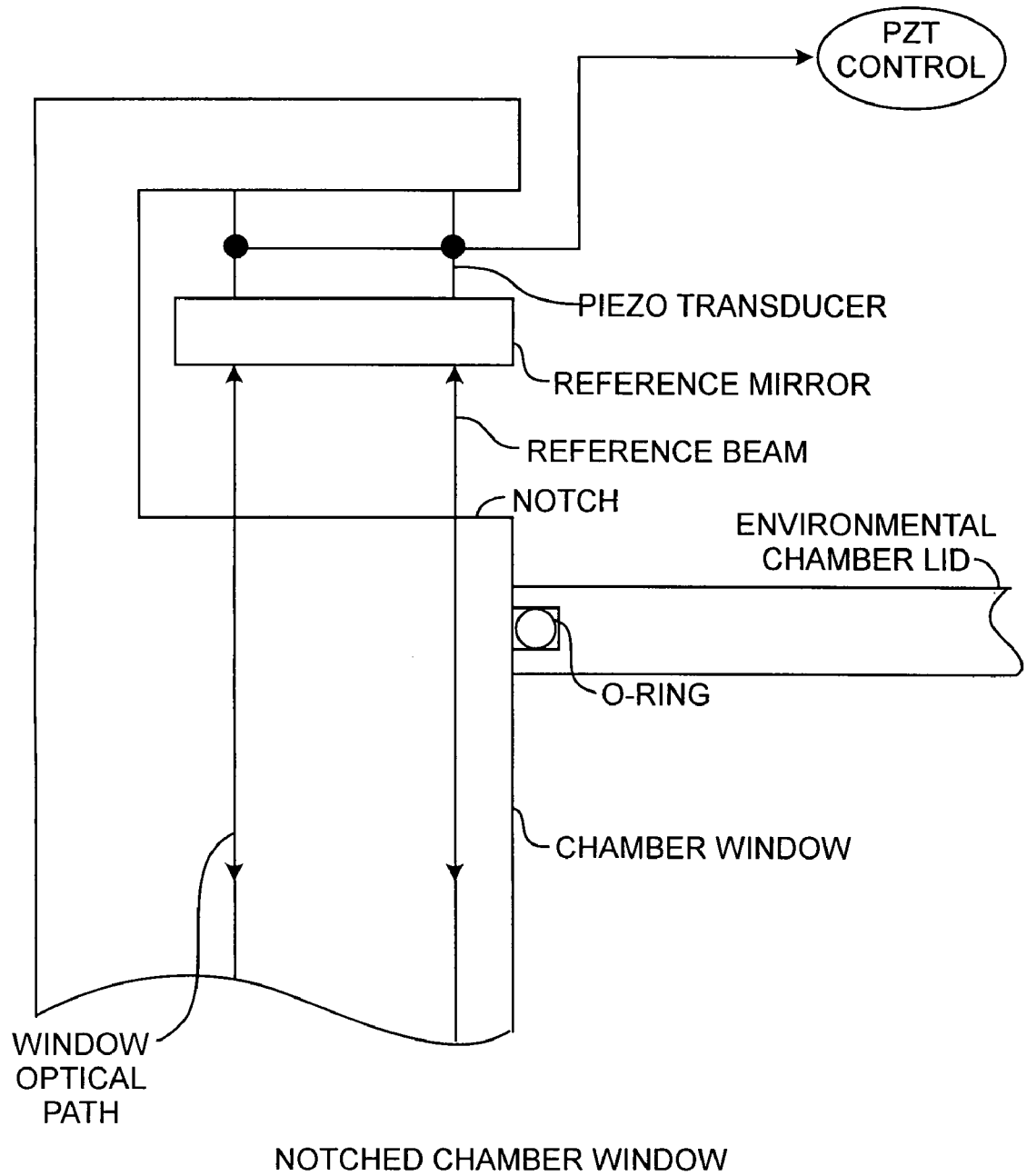
FIG. 2A depicts a notched chamber window.

Referring to FIGS. 1 and 2A, and more particularly to FIG. 2A, a notched chamber window in the chamber window includes a notch for receiving and disposing the reference mirror and the PZT transducer controlled by the PZT control signal. The reference mirror faces a polished and anti-reflection (AR) coated edge of the chamber window within the window notch pointing toward the beam splitter. The reference beam travels into the notch and reflects off the reference mirror along the window optical path. A notch portion of the chamber window extends either outside or inside the environmental chamber secured by an O-ring and external retaining compression ring. The PZT transducer and reference mirror may be disposed outside or inside the environmental chamber depending on the desired implementation. In this variation, overall window thickness, notch depth and width, and o-ring location are design dependent and vary depending on the use conditions, but must be chosen to provide the requisite mechanical rigidity and manufacturability.

Figure 2B:
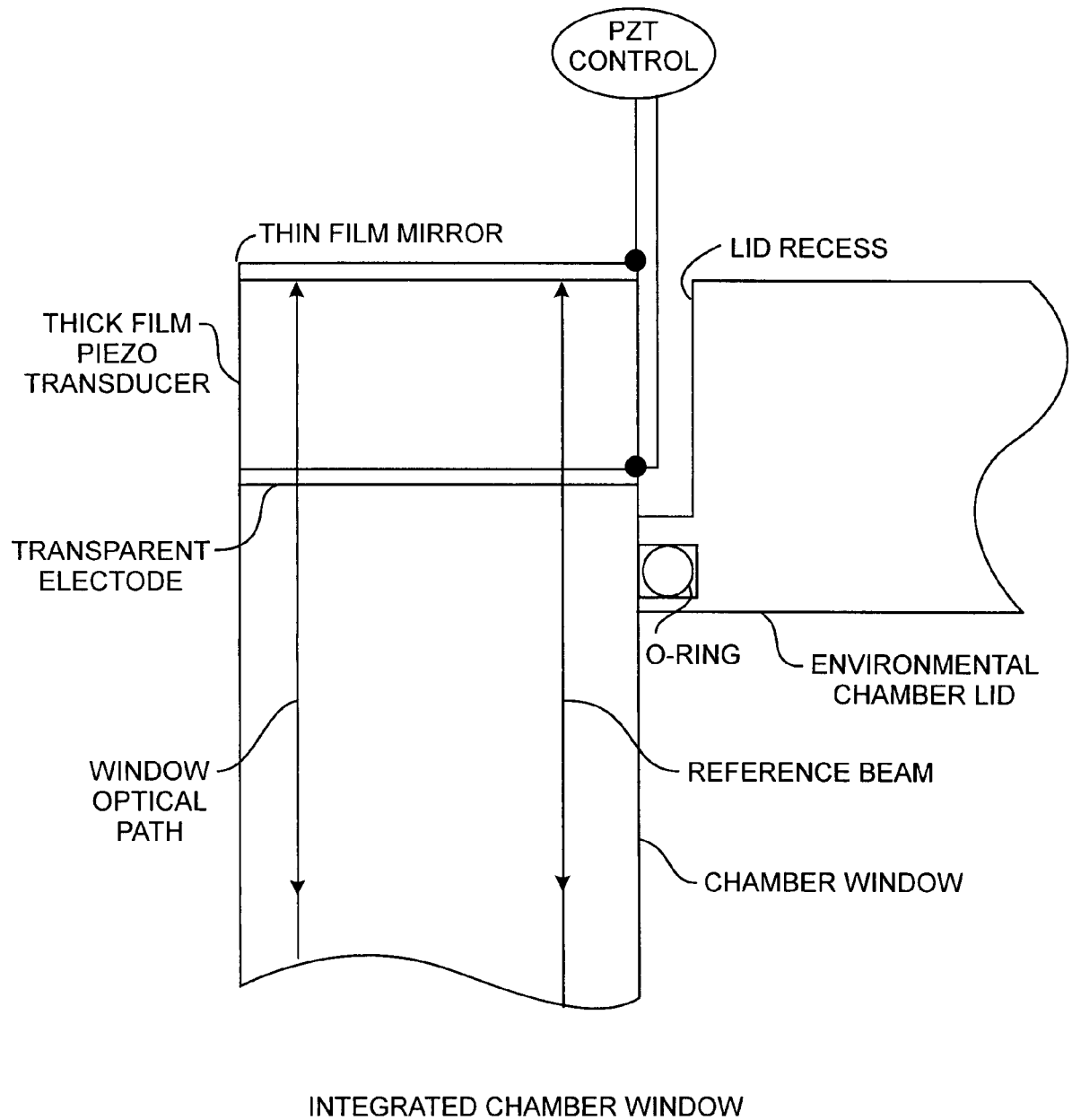
FIG. 2B depicts a deposited integrated chamber window.

Referring to FIGS. 1 and 2B, and particularly to FIG. 2B, the environmental chamber lid includes a lid recess for exposing a thick film transparent piezoelectric transducer, such as polycrystalline AlN, having a transparent electrode, such as impurity-doped ZnO, $In_2O_3$ and $SnO_2$, on an interior side and a thin conducting film mirror on an exterior side. The thin film mirror functions as the reference mirror. The transparent electrode is used to pass the reference beam along the window optical path in the chamber window. The transparent electrode also is used to control the actuation of the thick film Piezo transducer as the reference beam passes through the electrode thick film Piezo transducer and reflects off the thin film mirror. The environmental chamber lid is secured to the chamber window using an O-ring and external retaining compression ring. Major advantages of this implementation are that the optical path of the reference mirror is aligned during manufacture, reducing alignment constraints, and the integrated nature of the assembly further improves vibration isolation. In this variation overall window thickness, piezo transducer thickness, and o-ring location are design dependent and vary depending on the use conditions but must be chosen to provide the requisite mechanical rigidity, optical displacement and manufacturability.

Figure 2C:
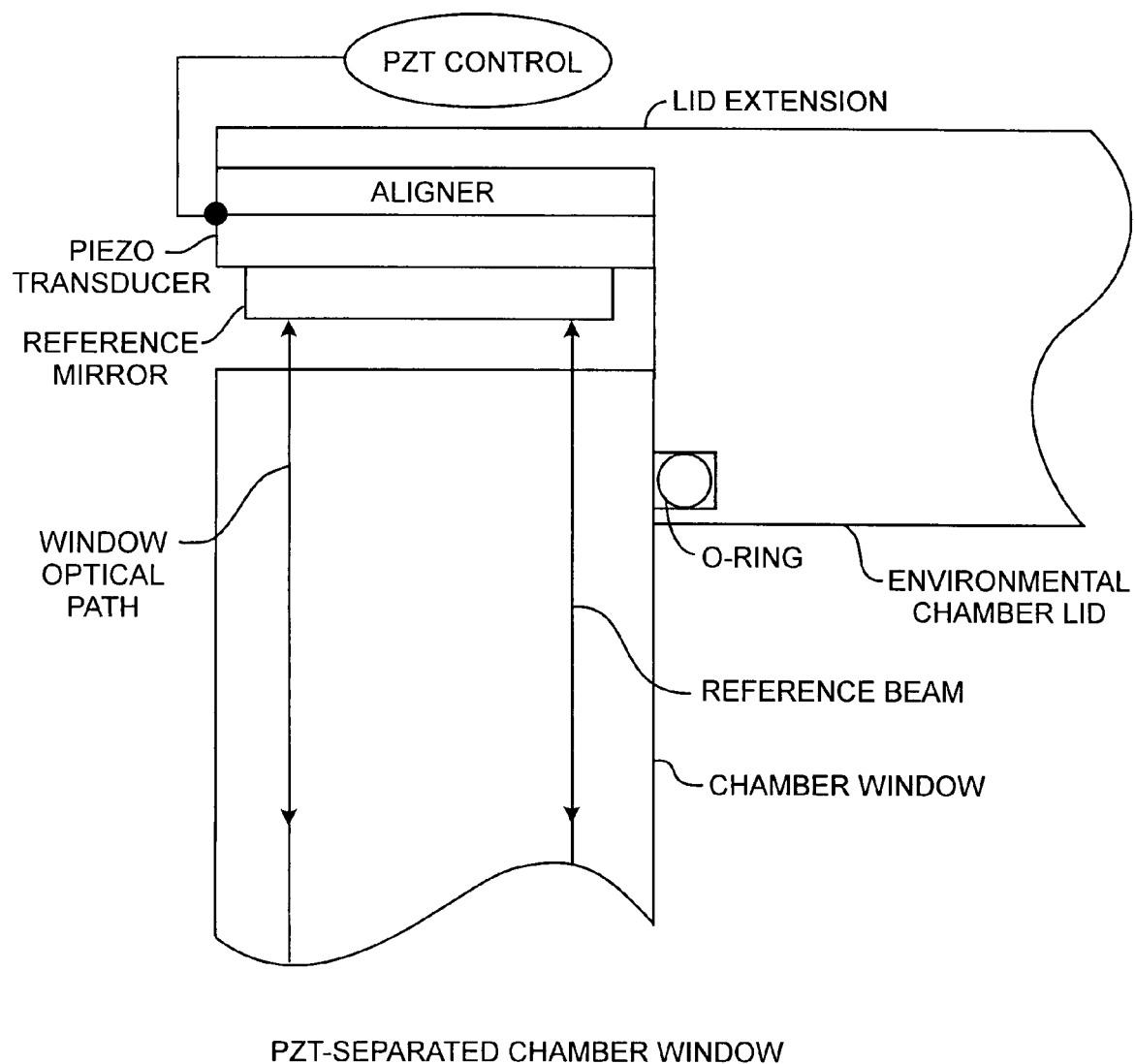
FIG. 2C depicts PZT-separated chamber window.

Referring to FIGS. 1 and 2C, and particularly to FIG. 2C, an environmental chamber lid includes a mechanical lid extension for securing the Piezo transducer to the environmental chamber. An o-ring and external retaining compression ring is used to secure the environmental chamber lid to the chamber window. The reference mirror is attached to the transducer with free space between an AR coated chamber window side facet and the reference mirror, through which the reference beam transits along the window optical path. A tilt, tip and translate aligner is used to align the reference mirror to the optical path to maintain alignment that might change over time such as during pressure changes or temperature changes in the chamber. The PZT control signals would include controls for aligning and translating the reference mirror.

Figure 2D:
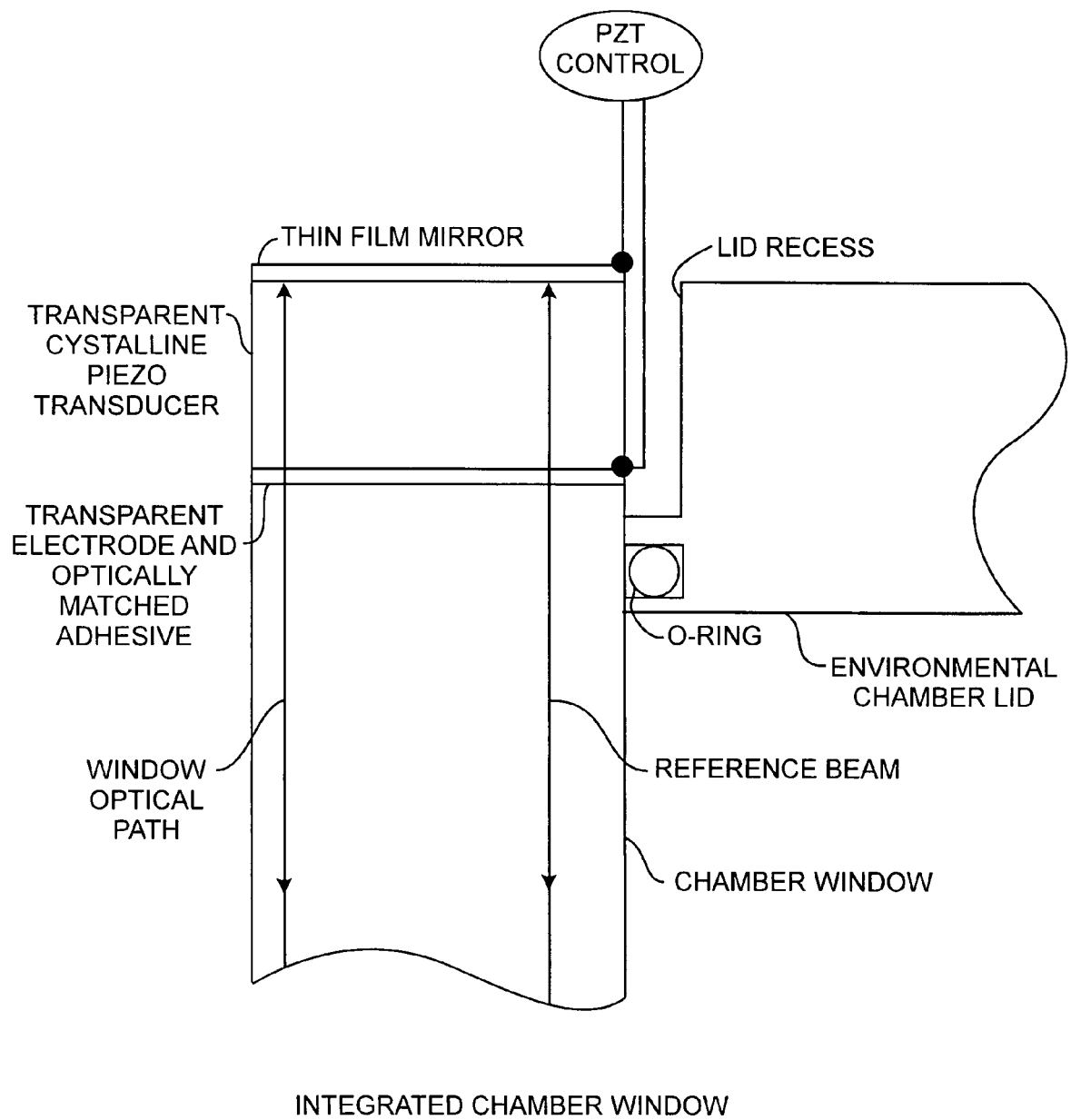
FIG. 2D depicts an assembled integrated chamber window.

Referring to FIGS. 1 and 2D, and particularly to FIG. 2D, the environmental chamber lid includes a lid recess for exposing a transparent Piezo transducer, such as crystalline Quartz transducer or a BaTiO3 transducer having a transparent conducting electrode. The electrode can be made of impurity-doped ZnO, $In_2O_3$ and $SnO_2$, or indium tin oxide, on an interior side and a thin film reference mirror on an exterior side. The thin film mirror functions as the reference mirror. The window edge is optically polished and anti-reflectively coated and the complete assembly is rigidly attached to the window with optically matched adhesive. The transparent electrode of the piezo transducer is used to pass the reference beam along the window optical path in the chamber window. The electrode is used to control the actuation of the Piezo electric transducer as the reference beam passes through the electrode Piezo transducer and internally reflects off the thin film mirror. The environmental chamber lid is secured to the chamber window using an O-ring and external retaining compression ring. A major advantage of this implementation is that optical path of the reference mirror is aligned during manufacture and assembly by optically observing fringes during adhesive cure. Additionally, the mechanical rigidity further improves vibration isolation. In this variation overall window thickness, Piezo transducer thickness, and o-ring location are design dependent and vary depending on the use conditions but must be chosen to provide the requisite mechanical rigidity, optical displacement, and manufacturability.

Referring to all of the Figures, various embodiments can be used to mount the PZT and reference mirror rigidly to the chamber window. The PZT can be mounted on the chamber window, in the chamber window, or disconnected from the chamber window and mounted to the environmental chamber lid. In all cases, the PZT and reference mirror are effectively rigidly mounted to the chamber window in direct line of the window optical path. The microscope objective that is preferably a compound lens, is placed so as to view the device under test within the chamber, and is placed along the middle region of the forty five degree beam-splitter in the chamber window. The middle region in the window and about the splitter is used, through which the reference beam and the object beam may be translated to interferometricly observe devices under test. The environmental view-port chamber window is used for observing the electromagnetic spectra, including preferred visible optical spectra as well as ultraviolet spectra and infra-red spectra.

An improved implementation could be made using a view-port chamber that prismatically disperses light, or otherwise modifies optical information, such that transmitted or reflected spectra from a device under test could be made to ascertain surface optical characteristics, such as chemical spectra and device performance. Another improved implementation is that the view-port chamber window could be made with a patterned set of electrodes on glass that excludes polarizations, enhances certain wavelengths, or otherwise modifies radio frequency (RF) energy. The improved implementation allows RF spectra to be transmitted or reflected from a device under test to ascertain RF characteristics, such as polarization, and RF performance. The broad form includes an optics device rigidly mounted in, on, or juxtaposed to the window chamber for modifying the object beam of a predetermined spectra reflected off the DUT.

The invention is particularly directed, in the preferred form, to providing a high vibration and noise immunity of the reference beam and the object beam from a device under test for imaging and observing the DUT. In the preferred form, an absolute phase reference between the reference beam and the object beam is acquired for precise interferometry, and perfected through the use of system component integration, optical view-port chamber window, a beam splitter, and a PZT actuated reference mirror. This configuration also simplifies optical alignments. Only simple optical microscopic imaging of the device region of interest needs to be performed with the illumination of the DUT and reference mirror with laser light source. All critical interferometer alignment is done upon fabrication. As such, the interferometer is self-aligned.

The stroboscopic imaging interferometer has the advantage of being able to change the objective lens, such as the compound lens. The stroboscopic imaging interferometer allows for practical interferometric imaging over large ranges of temperature and atmospheres. The stroboscopic imaging interferometer provides high optical efficiency of light use by placing a Gaussian beam profile with a highly coherent phase-front across the region of interest.

The stroboscopic imaging interferometer applications are wide ranging including observations, testing, and qualifying of MEMS devices. The stroboscopic imaging interferometer allows for rapid testing, in situ, of MEMS devices while the devices are in motion, under various environmental conditions. Because of the rigid construction of the interferometer and environmental test chamber, the stroboscopic imaging interferometer can simplify testing of devices at even ambient atmospheres and temperatures. Those skilled in the art can make enhancements, improvements, and modifications to the invention, and these enhancements, improvements, and modifications may nonetheless fall within the spirit and scope of the following claims.

What is claimed is:

1. A window in a chamber of an interferometry system, the window providing for absolute phase observations of a device in the chamber, the window comprising,
   a window optical path for receiving an illuminating beam,
   window optics for illuminating the device with the illuminating beam, the device reflecting the illuminating beam as an object beam, the window being rigidly attached to the chamber,
   a window reference path for receiving a reference beam from reference optics rigidly coupled to the window optics, the reference beam interfering with object beam for providing the absolute phase observations of the device, and
   wherein, the illuminating beam is a pulsed laser beam and the phase observations are stroboscopic phase observations.

2. The window of claim 1 wherein,
the window optics include a splitter for passing the illumination beam along the window reference path and for reflecting the illumination beam toward the device.

3. The window of claim 1 wherein,
the reference optics include a reference mirror receiving the illuminating beam and providing the reference beam reflected along the reference path.

4. The window of claim 1 wherein,
the reference optics include a reference mirror receiving the illuminating beam and providing the reference beam reflected along the reference path, and
the reference path and window path are in coincident alignment.

5. The window of claim 1 wherein,
the window further comprises an actuator rigidly coupled to the reference optics,
the reference optics include a reference mirror receiving the illuminating beam and providing the reference beam reflected along the window reference path, and
the window reference path and the window optical path are in coincident alignment.

6. The window of claim 1 wherein,
the window further comprises an actuator rigidly coupled to the reference optics and the window optics,
the reference optics include a reference mirror receiving the illuminating beam and providing the reference beam reflected along the reference path towards the window optics,
the window reference path and the window optical path are in coincident alignment, and
the window optics include a splitter for passing the illumination beam along the window reference path and for reflecting the illumination beam toward the device.

7. The window of claim 1 wherein,
the window further comprises an actuator rigidly coupled to the reference optics and the window optics,
the reference optics include a reference mirror receiving the illuminating beam and providing the reference beam reflected along the reference path towards the window optics,
the window reference path and the window optical path are in coincident alignment,
the window optics include a splitter for passing the illumination beam along the window reference path and for reflecting the illumination beam toward the device,
the illuminating beam is a pulsed laser beam, and
the phase observations are stroboscopic phase observations.

8. The window of claim 1 wherein,
the window further comprises an actuator rigidly coupled to the reference optics and the window optics,
the actuator includes a piezo transducer,
the reference optics include a reference mirror receiving the illuminating beam and providing the reference beam reflected along the reference path towards the window optics,
the window reference path and the window optical path are in coincident alignment,
the window optics include a splitter for passing the illumination beam along the window reference path and for reflecting the illumination beam toward the device,
the illuminating beam is a pulsed laser beam, and
the phase observations are stroboscopic phase observations.

9. The window of claim 1, wherein
the window further comprises an actuator rigidly coupled to the reference optics and the window optics,
the window further comprises a notch for receiving the actuator the reference optics include a reference mirror receiving the illuminating beam and providing the reference beam reflected along the reference path towards the window optics,
the window reference path and the window optical path are in coincident alignment,
the window optics include a splitter for passing the illumination beam along the window reference path and for reflecting the illumination beam toward the device, and
the illuminating beam is a laser beam.

10. The window of claim 1, wherein
the window further comprises an actuator rigidly coupled to the reference optics and the window optics,
the actuator includes a thick film piezo transducer,
the reference optics include a thin film mirror receiving the illuminating beam and providing the reference beam reflected along the reference path towards the window optics,
the window reference path and the window optical path are in coincident alignment,
the window optics include a splitter for passing the illumination beam along the window reference path and for reflecting the illumination beam toward the device, and
the illuminating beam is a laser beam.

11. The window of claim 1 wherein,
the window further comprises an actuator rigidly coupled to the reference optics and the window optics through the chamber,
the actuator includes a piezo transducer,
the reference optics include a reference mirror receiving the illuminating beam and providing the reference beam reflected along the reference path towards the window optics,
the window reference path and the window optical path are in coincident alignment,
the window optics include a splitter for passing the illumination beam along the window reference path and for reflecting the illumination beam toward the device, and
the illuminating beam is a laser beam.

12. The window of claim 1 wherein,
the window further comprises an actuator rigidly coupled to the reference optics and the window optics through the chamber,
the actuator includes a piezo transducer,
the reference optics include a reference mirror receiving the illuminating beam and providing the reference beam reflected along the reference path towards the window optics,
the window reference path and the window optical path are in coincident alignment,
the window optics include a splitter for passing the illumination beam along the window reference path and for reflecting the illumination beam toward the device,
the illuminating beam is a laser beam, and
the system comprises a lens and imager for receiving the observations, comprises a pulsed laser for providing the illumination beam, and comprises a controller for controlling the pulse laser, actuators and the device.

13. The window of claim 1 further comprising,
an aligner for aligning the reference path with the window optical path.

14. A device comprising:
a window in a chamber of an interferometry system,
a light source for injecting an illuminating beam into a window optical path,
the window providing for absolute phase observations of a device in the chamber, the window comprising,
window optics for illuminating the device with the illuminating beam, the device reflecting the illuminating beam as an object beam, the window being rigidly attached to the chamber,
a window reference path for receiving a reference beam from reference optics, the reference beam interfering with object beam for providing the absolute phase observations of the device, and
the window including an embedded beam splitter for passing the illumination beam along the window reference path and for reflecting the illumination beam toward the device.

15. A device comprising:
a window in a chamber of an interferometry system,
a light source for injecting an illuminating beam into a window optical path,
the window providing for absolute phase observations of a device in the chamber, the window comprising,
window optics for illuminating the device with the illuminating beam, the device reflecting the illuminating beam as an object beam, the window being rigidly attached to the chamber,
a window reference path for receiving a reference beam from reference optics rigidly coupled to the window optics, the reference beam interfering with object beam for providing the absolute phase observations of the device, and
wherein, the illuminating beam is a pulsed laser beam and the phase observations are stroboscopic phase observations.

16. The window of claim 15 wherein,
the window optics include a splitter for passing the illumination beam along the window reference path and for reflecting the illumination beam toward the device.

17. The window of claim 1 wherein,
the reference optics include a reference mirror receiving the illuminating beam and providing the reference beam reflected along the reference path.

18. The window of claim 15 wherein,
the reference path and window path are in coincident alignment.

19. An apparatus for interferometry comprising,
a window rigidly coupled to a chamber enclosing a device under test,
an optical beam splitter embedded in the window, and
an illuminating beam reflected by the beam splitter illuminating the device.

\* \* \* \* \*